US008389057B2

(12) United States Patent  (10) Patent No.: US 8,389,057 B2
Knox et al.  (45) Date of Patent: Mar. 5, 2013

(54) SYSTEMS AND METHODS FOR PRINTING ELECTRONIC DEVICE ASSEMBLY

(76) Inventors: Douglas Knox, Stouffville (CA); Jayna Sheats, Palo Alto, CA (US); Ric Asselstine, Waterloo (CA)

( * ) Notice: Subject to any disclaimer, the term of this patent is extended or adjusted under 35 U.S.C. 154(b) by 795 days.

(21) Appl. No.: 12/418,612

(22) Filed: Apr. 6, 2009

(65) Prior Publication Data

US 2010/0255179 A1  Oct. 7, 2010

(51) Int. Cl.
*H05K 3/00* (2006.01)
*H05K 13/00* (2006.01)
*B05C 11/00* (2006.01)

(52) U.S. Cl. ............... 427/287; 427/256; 427/427.1; 427/427.2; 427/427.3; 427/421.1; 427/8; 427/96.1; 156/349; 156/378; 156/384; 156/387; 29/592; 29/592.1; 29/593; 29/700; 29/729

(58) Field of Classification Search .......... None
See application file for complete search history.

(56) References Cited

U.S. PATENT DOCUMENTS

| 6,946,178 B2 | 9/2005 | Sheats et al. |
| 7,141,348 B2 | 11/2006 | Sheats et al. |
| 2002/0083579 A1* | 7/2002 | Suhara et al. ............ 29/739 |
| 2003/0113039 A1* | 6/2003 | Andersson et al. ........ 382/305 |

* cited by examiner

*Primary Examiner* — Nathan Empie
*Assistant Examiner* — Lisha Jiang
(74) *Attorney, Agent, or Firm* — Tue Nguyen

(57) ABSTRACT

The present invention discloses systems and methods for printing functional blocks from a plurality of printheads to a target substrate. In exemplary embodiments, the printing system comprises a main printhead for the majority of printing process, and a secondary printhead for supplemental printing. The system further comprises a controller, utilizing a positioning intelligence system to distribute the printing of the functional blocks between the main printhead and the secondary printhead, to minimize the motions of the printheads while maximize the printing speed.

8 Claims, 8 Drawing Sheets

SYSTEMS AND METHODS FOR PRINTING ELECTRONIC DEVICE ASSEMBLY

BACKGROUND

There is a need to distribute functional blocks such as integrated circuit chips across large area substrates, such as a roll-to-roll substrate or a plurality of panel substrates where the active circuitry such as the functional blocks only occupies a small fraction of the substrate. Thus it may be advantageous to process the functional blocks in a different substrate and then transfer the completed functional blocks to the final substrates. Prior arts include processes in which the functional blocks are deposited into a substrate using a pick-and-place or a fluidic-self assembly process.

The fluidic self assembly process employs fluid transport to assemble functional blocks on a substrate. The fluidic self assembly process mixes the functional blocks in a fluid and then dispenses the mixture over the surface of the receiving substrate where the functional blocks randomly align onto receptor regions.

An exemplary pick and place process uses a human or robot arm to pick each functional block and place it into its corresponding location in the assembly substrate. The pick and place process is usually serial, placing one functional block at a time, and is thus slow for numerous devices such as RFID devices or pixels of large arrays, and difficult for very small devices because the pick and place unit is hard to make in a small size.

Pick and place machines are not ideally suited to this type of production, because of speed limitations as well as the fact that the components are in many cases preferably small (less than a few hundred micrometers on a side, and more preferably less than 100 micrometers on a side). In addition, one of the advantages of pick and place technology, which is the ability to place a component anywhere, in any orientation, is less useful when the product has a very regular geometry and is being made in extremely high volume (millions to billions per year, or even more). There is accordingly a need for machines which can satisfy these needs.

SUMMARY OF THE DESCRIPTIONS

The present invention discloses systems and methods for printing functional blocks or components (such as electronic device assemblies or thin film devices), for example, from a plurality of printheads to a target substrate. The functional blocks are mounted on printheads and transferred to a target substrate at the appropriate locations based on the relative motion of the printheads and the target substrate. In exemplary embodiments, the printing system comprises a main printhead for the majority of printing process, and a secondary printhead for supplemental printing. The system further comprises a controller to distribute the printing of the functional blocks between the main printhead and the secondary printhead, to minimize the motions of the printheads while maximize the printing speed.

In an embodiment, the controller controls the transfer of the functional blocks from the printheads to the target substrate. The default printing process is from the main printhead to the target substrate. In an aspect, the printing speed of the main printhead is preferably maintained constant with respect to the target substrate to achieve a predetermined throughput. The main printhead preferably contains a large number of functional blocks, and is moving across the target substrate with limited motion along the length of the target substrate and limited rotation. Thus when it is not desirable to print a functional block from the main printhead, the controller will direct the main printhead to skip the target position, and to continue with the next functional blocks. The missing target locations will then be printed with the secondary printhead. The secondary printhead preferably contains a smaller number of functional blocks, and is moving in much broader motions, across and down the substrate with rotational capability. In an aspect, the controller determines the locations and orientations of the functional blocks in the printheads, and also the locations and orientations of the positions on the target substrate. Movements of the printheads relative to the target substrates are calculated with the maximum possible errors resulting from the transfer process. If the possible error exceeds a tolerant level, meaning the functional blocks might be positioned out of specifications, e.g., out of the acceptable position or orientation of the functional block onto the target location, the controller can first attempt to direct the main printhead to move or rotate to compensate for the error. If compensation is not possible, for example, due to other constraints, the controller then directs the main printhead to skip printing to the target position, and directs the secondary printhead to print onto the missing locations.

In an embodiment, the transfer of the functional blocks to the target substrate is accomplished using photoactivated thermal elements. The functional blocks are positioned on a donor substrate, through a polymeric photoactivated thermal transfer material, and can be transfer to the target substrate by heating and photon irradiation. A moving mechanism positions the printhead with respect to the target substrate where the printhead releases individual functional blocks on the target substrate.

In an embodiment, the target substrate comprises a solid or flexible substrate. The target substrate can comprise a roll-to-roll flexible substrate rolling in one direction, with the printheads moving across and down the substrate. The substrate can be RFID web, comprising pre-printed antennas with locations and connections for the RFID chips, which will be printed from the printheads.

In an embodiment, there is a plurality of main printheads, designed to accommodate the normal operation of the printing process with a predetermined throughput. For example, if the printing reservoir in a main printhead is circular, a number of main printheads can be used to print with high speed and efficiency to a linear array of functional blocks in the target substrate. In an embodiment, there is a plurality of secondary printheads to accommodate the missing printing locations, allowing the main printheads to move with a high speed and stricter accuracy requirements. The secondary printheads can also accommodate the refill of the printing reservoir, employing the secondary printheads to serve as the main printheads while the main printheads are stopped for re-fill with new functional blocks. In an aspect, the throughput during the main printhead re-filled period can be reduced to accommodate the capability of the secondary printheads.

BRIEF DESCRIPTIONS OF THE DRAWINGS

DETAILED DESCRIPTIONS OF THE PREFERRED EMBODIMENTS

Figure 1:
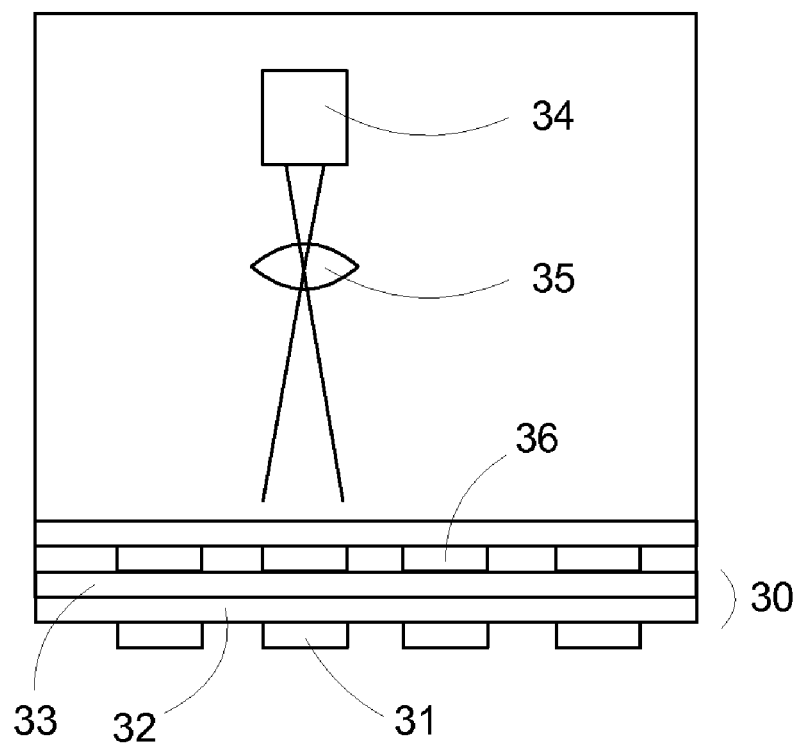
FIG. 1 illustrates an exemplary printhead according to embodiments of the present invention.

Embodiments of the present invention pertain to methods and apparatuses of transferring processed functional blocks or components from a donor substrate to an assembly substrate. In an embodiment, the present invention provides a machine which can obtain components with essentially any orientation and position from a donor substrate, and arrange for their deposition or printing at any position and with any orientation on any target substrate, at a high throughput and low capital cost, and with a high yield of correctly placed components. In an aspect, the components in the machine experience a minimum number of steps in which they are touched by physical elements. In an embodiment, the present invention discloses a positioning intelligence system, called the Dynamic Individual Target Acquisition System (DITAS), which can minimize the number of separate printheads required, and the extent of their motion, to satisfy the needs of a given set of input component geometries, target geometries, and machine and substrate positional uncertainties, while maximizing speed and minimizing machine cost. In an aspect, the system can make it possible to use a wide variety of incoming component geometries efficiently with a minimum of complexity of the subsystem which places the array of components onto the printheads.

In the operation of this printing process, the components need to be placed on the target substrate according to specifications of accuracy and precision which vary from one product to another. The components are extracted from donor substrates where they have been fabricated or otherwise prepared in certain positions, with certain specifications of orientation and distance between components, and precision thereof, which vary from one source to another. In the prior art, the movement of components from source (for example in a waffle tray, on a tape, or in other modalities of presentation) to destination is accomplished by so-called "pick and place" machines, which include robot-like mechanical handling arms with multiple degrees of motional freedom and machine vision systems to guide the arms to the correct position for picking up any part (typically holding it by applying a vacuum through a small nozzle or array of nozzles), and for placing it as desired.

While these prior art mechanical systems have served the industry well, they encounter performance limits as the designers attempt to make them move ever faster in order to achieve higher throughput (without increasing capital cost) and to handle smaller components, which are prone to misorientation, as well as thinner ones, which are prone to breakage. Thus there is a need for component handling systems which can transfer larger numbers of components, as well as smaller and thinner components, without suffering from these limitations.

In an embodiment, the present invention pertains to devices which are fabricated using photoactivated thermal transfer elements as described in U.S. Pat. No. 6,946,178 and U.S. Pat. No. 7,141,348 by Sheats, et al., hereby incorporated by reference. These patents disclose a method of transferring, or printing, thin film devices (or functional blocks) from a donor substrate, on which the polymeric photoactivated thermal transfer material has been applied, onto a target substrate. In this process, irradiation with actinic light is used to selectively activate the polymer under a device which the user wishes to transfer, while leaving other devices on the same substrate unactivated. Heating the polymer (referred to herein as a Digital Release Adhesive, or DRA) causes it to vaporize and transfer the device to a target substrate in close proximity while leaving the unactivated devices on the donor substrate. By this method, such objects as very small integrated circuit chips, with lateral dimensions of less than 100 microns, for example, which are difficult or impossible to handle effectively by other means such as the pick and place machines which are well known in the art, can be placed onto product substrates at very high speed. The invention is advantageously used for small and thin silicon chips, but may also be used with any object which is thin enough to be readily adhered to a thin polymer film; for example light emitting diodes, thin film sensors, MEMS devices, thin film capacitors or resistors, and other electronic or optical components.

FIG. 1 illustrates an exemplary printhead which comprises a reservoir 30 of functional blocks 31 for deliver onto the assembly substrate. In an embodiment, the functional blocks are adhered to a donor substrate 33 through a releasable adhesive 32. The printhead can be attached to precision motion control stages. The position of the stage is determined by feedback from machine vision systems, such as digital cameras, which observe alignment marks on both the printhead and the target substrate, and compute the required motion of the printhead to achieve alignment.

The printhead can comprise a releasing mechanism to release the functional blocks. In an embodiment, the releasing mechanism comprises a heat source and a light source, which act upon the releasable adhesive to deactivate the adhesive. The light source can include an optical exposure unit 34, such as for example a laser beam or other imagable optical source, together with an optical alignment system 35 provided for aligning the light source, so that the adhesive polymer under a specific functional block is irradiated.

Subsequently, or concurrently, in an embodiment, it is also necessary to provide heat to this area of the polymer. Thus the releasing mechanism can comprise a heat source, such as an array of heating elements 36 for heating the adhesive. In an embodiment, the deactivation of the releasable adhesive is similar to the operation as described in U.S. Pat. No. 6,946,178 and U.S. Pat. No. 7,141,348 in which the entire donor substrate and associated polymer may be heated to the temperature which effects polymer decomposition, since only the irradiated polymer decomposes at this temperature, while the remaining polymer is affected only at a substantially higher temperature. Thus, in one embodiment of the invention, the entire substrate is heated to the desired temperature, and upon irradiation of a selected spot, the device adhered to that spot is immediately transferred.

In an embodiment, the functional blocks can be an integrated circuit such as a RFID circuit, fabricated from a semiconductor wafer, a plastic film, a glass sheet, or a multilayer film comprising these materials. The functional blocks can be transferred as a dense array to a reservoir on the printhead. The functional blocks can be fabricated on a substrate such as a wafer, in a semiconductor fabrication facility. In an aspect, the wafer can be thinned and diced. Thinning, by a combination of grinding (for example with a diamond grinding wheel) and polishing (with chemical mechanical polishing such as is used to make silicon wafers very flat) are used and are well known in the industry; wafers with thicknesses down to 20 or even 15 μm are routinely provided. Dicing may be done with a standard saw, but at the cost of requiring a wide kerf or street width (up to 100 μm) which wastes considerable space when the width of an entire functional block is 100 μm or less. Alternatives are the use of lasers, which can readily achieve widths of 20 μm, and deep plasma etching, which requires a photoresist but has even higher resolution. Before dicing, the wafer is adhered to an adhesive tape (usually called a blue tape) to prevent individual device separation.

When this preparation is finished, the functional blocks, separated from each other, are still adhered to the blue tape, positioned exactly as they were when they were attached to each other. There may be some inhomogeneous stresses in the tape which are released when the functional blocks are released from each other, resulting in a small degree of difference between the lateral spacing of the functional blocks. This difference is at most a small fraction of that distance, and hence is far less than 1 μm. Thus the lateral position of the functional blocks is very well known, and very uniform, at this point in the process. The vertical position is also well known and uniform, because they have not moved since the time at which they were part of a single, very flat wafer, and the thinning process has a thickness repeatability of approximately +/−3 μm.

In an embodiment, the functional blocks are loaded to the printhead at a printhead loading station. In an aspect, to load the printhead, the blue tape in its frame is placed on a fixture which holds the frame, and places a very small amount of tension on the tape. The tape will be stretched by this tension, up to an amount not exceeding a few percent. This is sufficient to ensure uniform and reproducible positioning of all of the functional blocks on the wafer in the vertical direction, and any nonuniformity in the lateral direction is still well under +/−10% of the functional block separation distance.

The loaded printhead is then mounted on a fixture with precision motion stages and optical alignment systems as previously described. The fixture also contains an optical beam delivery unit, which optionally accepts a fiber optic cable and contains one or more lenses and possibly other optical components for forming a uniform irradiation beam whose lateral extent slightly exceeds the dimensions of the device to be printed. The light source, if it is a laser, may be used to supply multiple printheads by means of beamsplitters and fiber optic cables. In this way, a relatively inexpensive printhead may be constructed which allows a printer to have multiple printheads to process multiple components in sequence at a cost which is less than the cost of using separate machines for each component. The printer is analogous, in this respect, to an ink printer in which the separate units of a multicolor printer are placed in sequence, and their cost adds up to much less than the cost of the basic printer with its substrate handling and curing components. It also allows for a custom configurable printer, so that a single base unit can supply the needs of different users who want to place different numbers of types of components, and who may wish to manufacture different products with these varying configurations at different times.

By constructing a flat, inexpensive printhead whose lateral size can be easily chosen in the range of centimeters (e.g., between 1 and 30 cm, preferably in the range of 3 to 10 cm), the transfer of devices for printing onto the printhead (which may be called a "pre-press" operation) is facilitated. If the devices are silicon functional blocks, for example, they are in many cases obtained in the form of a solid silicon wafer which has been processed into functional circuits. It may or may not have been already adhered to an adhesive-coated backing tape held in a stretched frame; this tape is often blue and called "blue tape" in the IC industry. Several companies sell tape suitable for this purpose; for example Nitto Denko and Lintec. The adhesive has the property that its stickiness can be reduced to a very low value by the application of either heat or UV light (according to the specific choice of material). This property is quite different from the property of the materials described in U.S. Pat. No. 6,946,178 and U.S. Pat. No. 7,141,348, which do not simply change their adhesive property but undergo a complete, clean and very rapid decomposition into vapor.

Figure 2A:
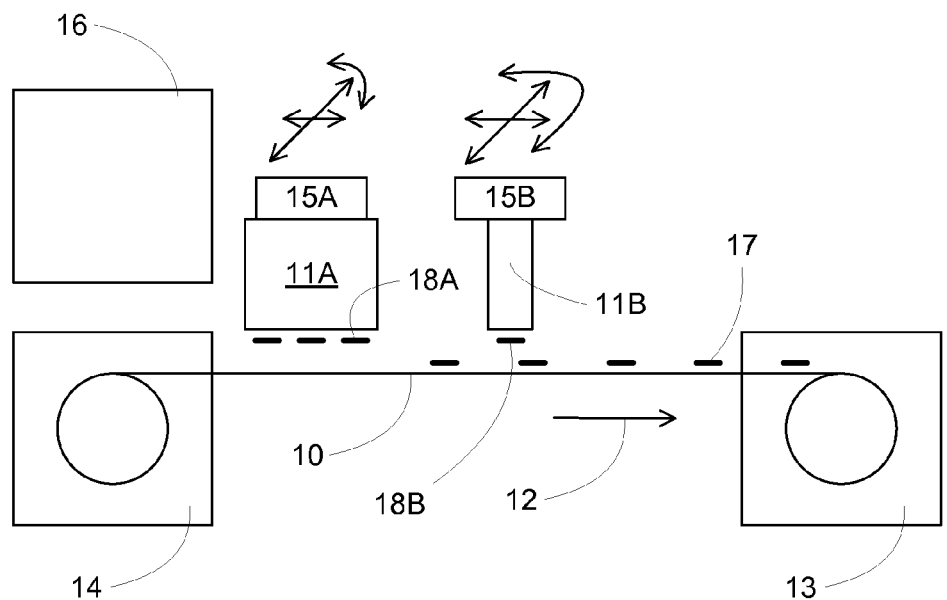
FIGS. 2A and 2B illustrate different views of an exemplary system comprising a roll-to-roll substrate and a plurality of printheads.
Figure 2B:
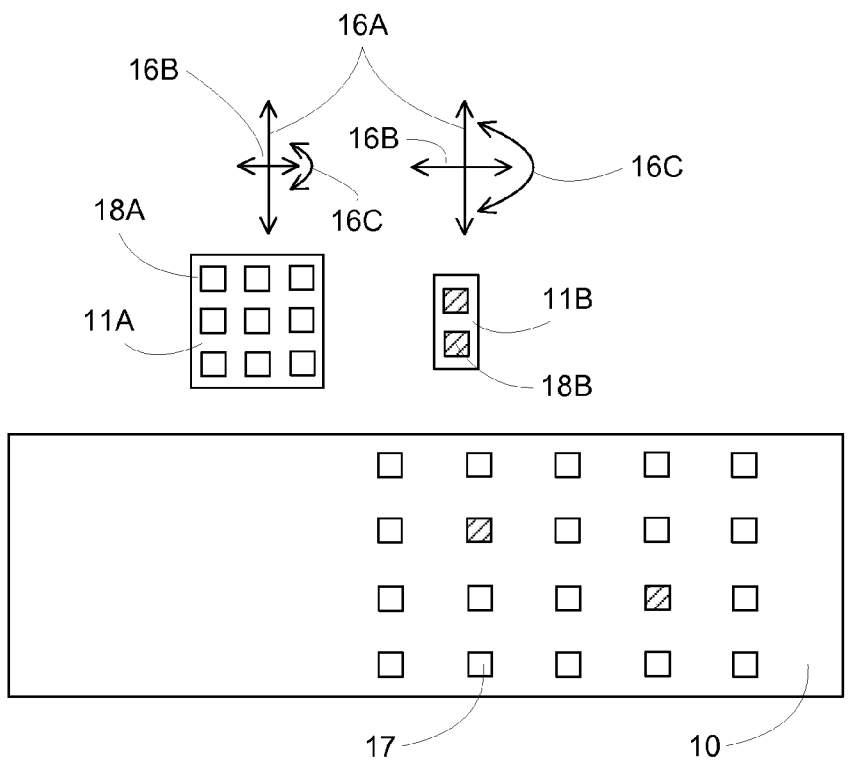

In an embodiment, the present invention includes a system and method for forming electronic assemblies employing a plurality of printheads. FIGS. 2A (side view) and 2B (top view) illustrate an exemplary embodiment of the present invention multiple printheads for efficient transfer of functional blocks to a substrate, comprising a plurality of printheads: one or more main printheads 11A and one or more secondary printheads 11B for printing on a roll-to-roll substrate 10. Alternatively, other types of substrates can be used.

In an embodiment, different types of printheads can be used to deliver the functional blocks. For example, one or more main printheads serve as the primary printheads, delivering the majority of the functional blocks. One or more secondary printheads serve as the supplemental printheads, supplementing the main printheads, for example, by delivering the functional blocks at target locations that the main printheads skip.

The system further comprises a substrate advancing mechanism, such as a motor in a station 13 to roll the roll-to-roll substrate in direction 12. The system also can comprise a substrate loading station 14 for preparing and loading the substrate. The printheads 11A and 11B are preferably mounted on motion control stages 15A and 15B which move the printheads in the directions across 16A, along 16B and/or rotational 16C with respect to the substrate where the printheads can deliver the functional blocks 18A and 18B onto the appropriate locations 17 on the substrate. The main printhead 11A preferably has limited motion along the substrate and limited rotating capability as compared to the secondary printhead 11B. The system can comprise printhead loading stations 16 for loading, such as gluing, the functional blocks onto the printheads. The functional blocks are adhered to the printheads through a releasable adhesive that can be deactivated by heat, light, or other conventional methods.

The printhead comprises a plurality of functional blocks adhered to a DRA-coated substrate as described above. The printhead may have a wide variety of sizes and shapes. For example, it may be a cylinder or a plate. It may be narrow (one or a few tracks wide, where the word "track" refers to the downweb line in which components are being printed; for example a line of RFID straps), or wide (for example up to the width of gravure printing cylinders which may be up to 4 meters wide). It may be square or rectangular or round (for example, the dimensions of a silicon wafer). It is understood that while the tracks are usually straight lines, they may not be; any relative downweb orientation of targets is possible within the scope of the invention.

The printheads may be located with respect to the substrate such that each proper location on the substrate is underneath a functional block on the printheads. To perform the transfer process, the releasable adhesive film is deactivated, for example, through heat and light sources, while the functional blocks are in contact with or proximity to the substrate. When the releasable adhesive is deactivated, the functional blocks are transferred to the substrate. Once the transfer process is completed, the printheads can move to another location, or the substrate can be advanced to a new location or a new substrate. Electrical contacts to one or more contact pads on the functional blocks can be made. The contacts might be a direct resistive electrical contact, or a capacitive or inductive electrical contact.

The system can include an alignment mechanism to align the printheads over the substrate over the proper locations. The plurality of printheads comprises main printheads and secondary printheads to improve the throughput of the printing system. In an aspect, the main printheads serve to print the functional blocks following a main pathway, without regard to minor variations of the individual components, thus comprising limited mobility that can deviate from the main pathway. In an exemplary embodiment, the substrate 10 advances along the direction 12, for example, by a moving motor. The main printhead 11A moves across 16A the substrate, preferably covering the whole width of the substrate for depositing functional components onto the substrate. The main printhead 11A can also comprise limited motion 16B along the substrate and limited rotational motion 16C with respect to the substrate surface. The limited motions generally serve to compensate for any variations in the positions of the functional components. In an aspect, to improve throughput, the main printhead 11A can select to skip printing at certain locations instead of compensating for the variations through the motions 16B and 16C. The secondary printheads serve to compensate for the component variations, comprising greater mobility lower storage capability to supplement the main printheads. The secondary printhead 11B has better mobility than the main printhead 11A, covering the width 16A and the length 16B of the substrate, together with rotational 16C capability to correct for any misorientation of the functional components. In an aspect, the secondary printhead 11B covers the whole substrate, depositing functional components to the locations that the main printhead decides to skip.

The type of substrate on which the components are to be mounted can be composed of rigid boards made from laminates of polymeric materials, often including inorganic fillers for structural and thermomechanical purposes, and plated or laminated metal layers for carrying current. These are commonly called "printed circuit boards", or PCBs. For a given product, the PCB is prepared with bonding pads which are placed in specified positions to match the I/O pads of the components which will be mounted on them. In some cases ultrasonic wirebonding tools are used to form connections between the two. In a flip-chip process (as is very commonly used today), solder balls or posts are formed on the component pads, the components are placed on the PCB (in some cases using some adhesive material for temporary stability of the placement), and the PCB is heated to melt or "re-flow" the solder, making low-resistance metallurgical connections which can withstand the thermal cycling and mechanical shocks to which the product may be subject. Generally the structural stability is enhanced by applying a polymer adhesive (called "underfill") in the remaining open space between component and board. One of the important reasons for the presence of the underfill is the inevitable mismatch in coefficient of thermal expansion (CTE) between silicon chips and the polymers of which the PCB is made.

Flexible PCBs, which may also be called "flex circuits" or Printed Circuit Tapes, are also made. Usually these are used in products for which flexibility of a set of conducting traces along with some electronic components is required; for example in various aspects of wiring harnesses in automobiles, in inkjet printer printheads, and other areas. Similar methods of assembly of the components onto the tape are used. The tapes may include one or multiple dielectric and conducting layers.

In recent years a particular set of products using flexible PCBs have grown in importance. These are generally called RFID (radio frequency identification) tags, and in their most common form consist of a single integrated circuit (IC) and an antenna. More complex RFID-based integrated systems are also made, in which batteries, sensors, and other ICs as well as passive components are required. Typically the latter systems are fabricated on solid boards similar to the standard electronic PCBs.

It is desirable for several reasons to be able to use flexible materials for these types of integrated system. In many cases, the RFID product is intended to be applied to some object (such as a cardboard box, a medicine bottle, or a bag) as an adhesive label. Often the label will have printing on it as any packaging label for marking the destination of a shipment, for example. The label would be prepared by a standard printing process running on roll-to-roll process equipment which is suited to high speed and low cost operation. Clearly such labels have to be flexible. The substrate material should also be low cost, and depending on the customer's requirements, may be plastic, thin paper, cardboard, or other such materials.

In a typical application, the components, e.g. functional blocks, which have been so printed, require some kind of electrical connection to each other or to an additional element which may be already present on the target substrate, such as a printed antenna for a radio frequency identification (RFID) tag. Thus, positional accuracy is important. In the specific case of making RFID tags, it is desirable to have the functional block positioned with respect to the antenna ends to a precision of about +/−25 microns. Other applications may have other specifications. If it is desired to electrically connect one functional block to another, the precision will be determined in part by the size of the bonding pads. These are a fraction of the size of the functional block, which itself may be well under 100 microns, perhaps only 50 microns or 25 microns on each side. Thus there is a requirement to position the device to be transferred with the corresponding level of precision.

In a preferred embodiment, the system is equipped with a locator system (such as a vision assembly or a laser locator assembly) which locates the components on the donor substrate, and records in digital memory their position status (e.g., xy positions and orientation) with respect to a fixed reference location. Alternatively, the locator can locate reference components together with the periodicities (for example, x and y periods) and calculates the locations of the individual components. It further locates the target positions (e.g., xy positions and orientation), which are generally marked on the incoming target substrate by some kind of fiducial mark, as the target approaches, and records these in memory. Next, it computes the position at which any given incoming component will be printed, assuming the minimum amount of mechanical motion in the system, and given the accuracy of the sum of steps required to effect printing. In the event that all of the components are predicted to be transferred to the intended positions within the specified accuracy, no further action is necessary. This would be the normal running condition of a printer in which the target positions are located on a regular repeating linear array (for example every 10 cm in each track of antennae), and the components are located on a regular repeating square array (as would be obtained from the diced chips of a silicon wafer, derived from the interior inscribed square). The period of the target positions may not be an integral multiple of the component period, but because the latter is so much smaller than the former for most applications, it requires very little motion of the main printhead to adjust each component to its proper printing position. The system is capable of making this compensation, which is very regular and predictable from the beginning.

Nevertheless, the geometry and performance of any real physical system will always have imperfections: the locations of components in a source which is populated by large numbers of thin film devices will have some finite uncertainty, and the desired target locations will not be separated by precisely determined distances since there will be some distortion of virtually any solid body, and some variation in the behavior of any transport mechanism. Webs (the name for the moving substrate in a roll-to-roll process) in particular are known to move around to some extent due to imperfect lateral tracking and changes in tension. The placement machine must be capable of positioning components in the context of these uncertainties, in accordance with (possibly different) product specifications.

Figure 3A:
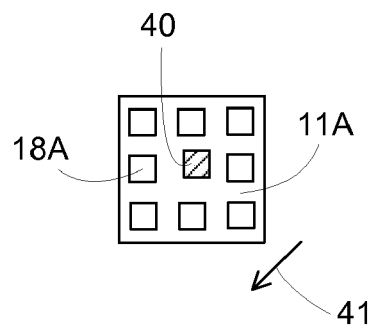
FIGS. 3A and 3B illustrate exemplary translational errors and rotational errors, respectively, on a printhead.
Figure 3B:
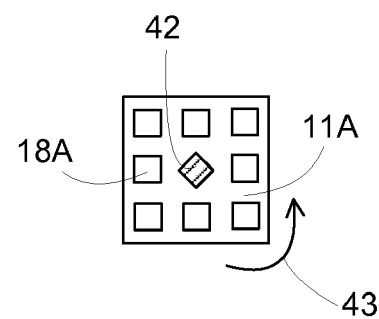

FIGS. 3A and 3B illustrate exemplary translational errors and rotational errors, respectively, on a printhead, for example, due to the uncertainties and distortions. FIG. 3A illustrates a printhead 11A with a plurality of functional components 18A disposed in a regular dense array, ready to be transferred to a substrate. In the array of functional components, functional component 40 has a translational error, located an offset from the regular position in the array. Thus in an aspect, the printhead 11A can have a translation variation 41 in movement, to print the functional component 40 at the proper location on the substrate. Alternatively, the printhead 11A may decide to skip printing functional component 40, and proceeds to the next functional components on the next substrate locations. A secondary printhead may be notified to print on the missing substrate location. FIG. 3B illustrates a plurality of functional components 18A on printhead 11A with functional component 42 having a rotational error. In an aspect, the printhead 11A can have a rotating variation 43 in movement, to print the functional component 42 at the proper location on the substrate. Alternatively, the printhead 11A may decide to skip printing functional component 42, proceeds to the next functional components and notifies a secondary printhead. Also, a functional component can have both translation error and rotational error.

Figure 4A:
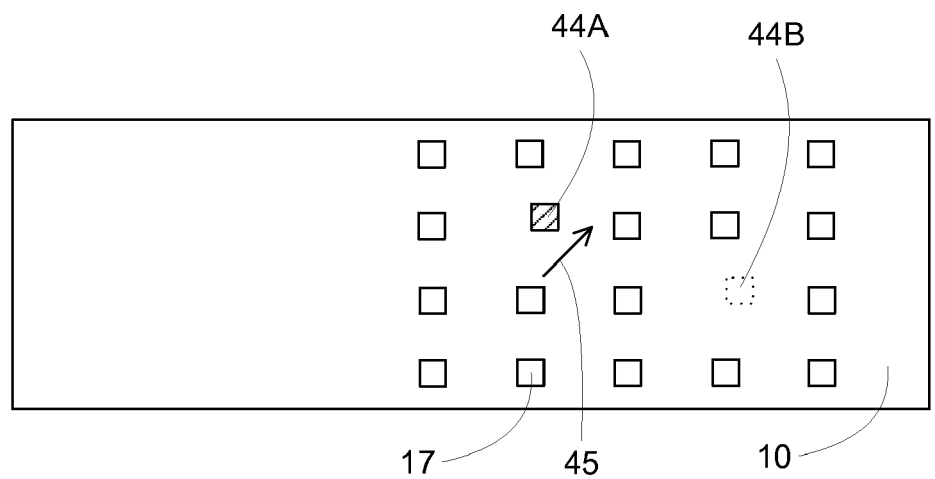
FIGS. 4A and 4B illustrate exemplary translational errors and rotational errors, respectively, on a substrate.
Figure 4B:
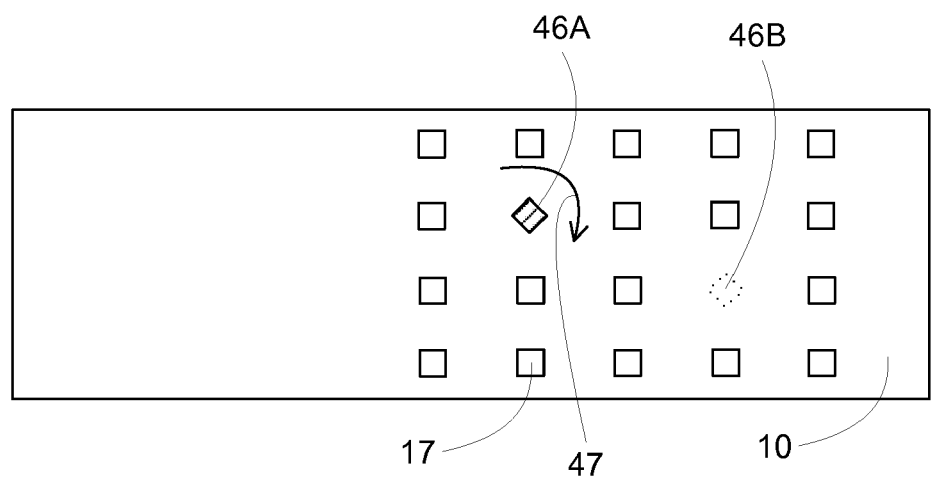

FIGS. 4A and 4B illustrate exemplary translational errors and rotational errors, respectively, on a substrate. FIG. 4A illustrates a substrate 10 with a plurality of functional components 17 deposited in a regular array from a printhead. In the array of deposited functional components, functional component 44A needs to be printed offset from the regular position in the array, for example, because of the mating component such as an antenna that has already printed on the substrate. The substrate is unlikely to deviate from a regular movement 12, thus in an aspect, the printhead can have a translation variation 45 in movement, to print the functional component 44A at the proper location on the substrate. Alternatively, the printhead may decide to skip printing at location 44B, resulting in a missing component on the substrate. A secondary printhead may be notified to print on the missing substrate location 44B. FIG. 4B illustrates a substrate 10 with a rotating functional component 46A. In an aspect, the printhead have a rotating variation 47 in movement, to print the functional component 46A at the proper location on the substrate. Alternatively, the printhead may decide to skip printing at location 46B, and notifies a secondary printhead to print on the missing substrate location 46B. A functional component with a combination of substrate translational and rotational errors can exist on the substrate. Also, printhead and substrate errors (translational and rotational) can exist for a functional component, thus requiring a combination of movement for the printhead.

In an embodiment, the present invention discloses a positioning intelligence system and method, called the Dynamic Individual Target Acquisition System (DITAS), to optimize the printing of functional components on a substrate. The system can comprise a controller, or a computer system with software to control the hardware components such as the operation of the printheads and the movement of the substrate to achieve a desired objective. For example, a desired objective of the present system and method is to achieve a high throughput with minimum cost. High throughput can bring lower product cost, and can be achieved with a high speed printing process. For example, the main printheads are implemented with constant printing speed to achieve a desirable throughput. Thus in an embodiment, main printheads are thus designed to skip printing at time-consuming printing locations, for example, due to excessive variations of main printheads from the intended trajectory. To compensate for the missing devices, secondary printheads are provided to print on the missing locations. The present system can include cost minimization, which include machinery cost, for example, by minimizing the number of printheads, and by simplifying their motions to achieve high reliability. The main printheads can have limited mobility and larger reservoir of functional components than the secondary printheads to simplify their design and lower fabrication cost. Printing accuracy is also desirable to improve cost minimization.

Figure 5:
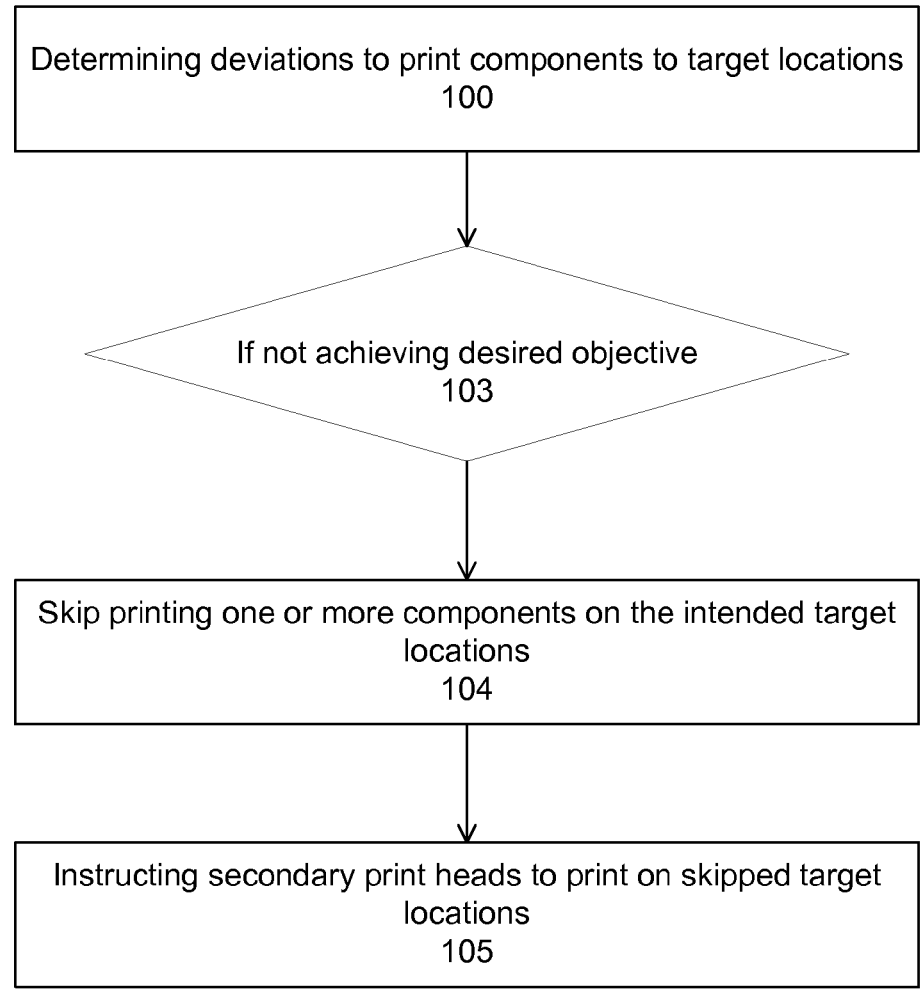
FIG. 5 illustrates a basic exemplary operation of the present system with one or more main printheads to print functional components on a substrate.

FIG. 5 illustrates a basic exemplary operation of the present system with one or more main printheads to print functional components on a substrate, preferably a web moving substrate. The main printheads, or a controller controlling the printheads, determine the positions (including orientation) of the functional components stored in the printheads, and the intended target positions (including orientation) on the substrate, taking into account of the moving substrate and the speed of the printheads. The movements of the main printheads with respect to the substrate, and the printing process of the functional components onto the substrate are then determined. The substrate preferably travels in a direction along the length of the substrate. The main printheads preferably travel along the width of the substrate to deposit the functional components on the substrate. Depending on the arrangement of the target locations on the substrate, the main printheads can travel in a direction perpendicular to the travel direction of the substrate, or a direction deviated a small angle from the perpendicular direction to account for the movement of the substrate. In operation 100, the deviations to print the functional components to the target locations on the substrate are determined, for example, the deviations from the regular pathway of the main printheads to account for the individual functional components on their corresponding target locations. The regular pathway is designed to accommodate the normal conditions of the printing process, and can allow certain deviations to meet certain requirements such as to achieve a desired throughput, or to achieve minimum additional movement for reliability purpose. In operation 103, a desired objective is evaluated due to the deviations. The desired objective can be a desired throughput, or a constraint requirement consideration such as minimum deviation movement due to the limited mobility of the main printheads, or the unavailability of deviation movement of the main printheads due to multiple track printing. For example, if the main printheads print on several tracks simultaneously, it may be impossible to adjust their position to satisfy the printing accuracy on all of components. In an aspect, a desired objective can always be achieved if the main printheads skip printing on the target locations. If the desired objective is met, the main printheads print the components and proceed to the next target locations. The printing process may comprise deviation movements of the main printheads, for example, the main printheads can adjust its position (either rotationally or translationally) to meet the specification. If the printhead has no conflicting demands (for example if it is intended to handle only one track), this deviation movement is possible. If the desired objective is not achieved, the main printheads skip printing of the one or more components on the intended target locations (operation 104). In an embodiment, to skip printing, the main printheads can instruct the optical illumination subsystem not to irradiate the area of one or more components which would otherwise be out of specification.

In the event that a particular position which is intended to receive a component has not received one due to such an instruction, the DITAS controller can instruct a downstream, or secondary, printhead to fill in this position (operation 105). The downstream printhead may, for example, be substantially smaller than the main printhead, and may be capable of roving back and forth across all or some portion of the web, since it is only expected to operate on a small percentage of the target positions. There may be one or more such downstream printheads, in both the crossweb and downweb directions. It is understood that any motion of any printhead is within the scope of the invention, so what has been called the "main" printhead (or printheads) may also move in any direction. However, for reasons of mechanical economy and precision, it will typically be advantageous to leave larger printheads (which hold many components, perhaps up to millions) in approximately one place, while providing smaller secondary printheads which move to fill in errors or gaps.

Another possible deviation to print a component on an intended target location is because there may be is no component at the appropriate location on the printhead. For example, suppose the chips from a circular silicon wafer have been transferred directly, without any additional operations, from dicing tape to printhead. The ideal geometry for printing onto a set of parallel tracks is a square or rectangular array, so that each track corresponds to the same number of components on the printhead. With a circular array, however, some tracks are aligned with a greater number of components on the printhead than others. It is a normal part of the operation of the printing process as disclosed in the previous patents (U.S. Pat. No. 6,946,178 and U.S. Pat. No. 7,141,348) that the printheads are indexed either laterally or longitudinally when necessary in order to supply components to the desired positions. However, this may still leave some tracks lacking components if a circular wafer of components has been placed without further repositioning onto a printhead. In this case, multiple printheads can be used, offset appropriately both laterally and downweb, so that each track is properly supplied. Two layers (downweb) of printheads with a partial offset would be sufficient for circular component patterns. Again, it might occur that a target position would on occasion still not receive a component, in which case a roving printhead would supply it.

Figure 6:
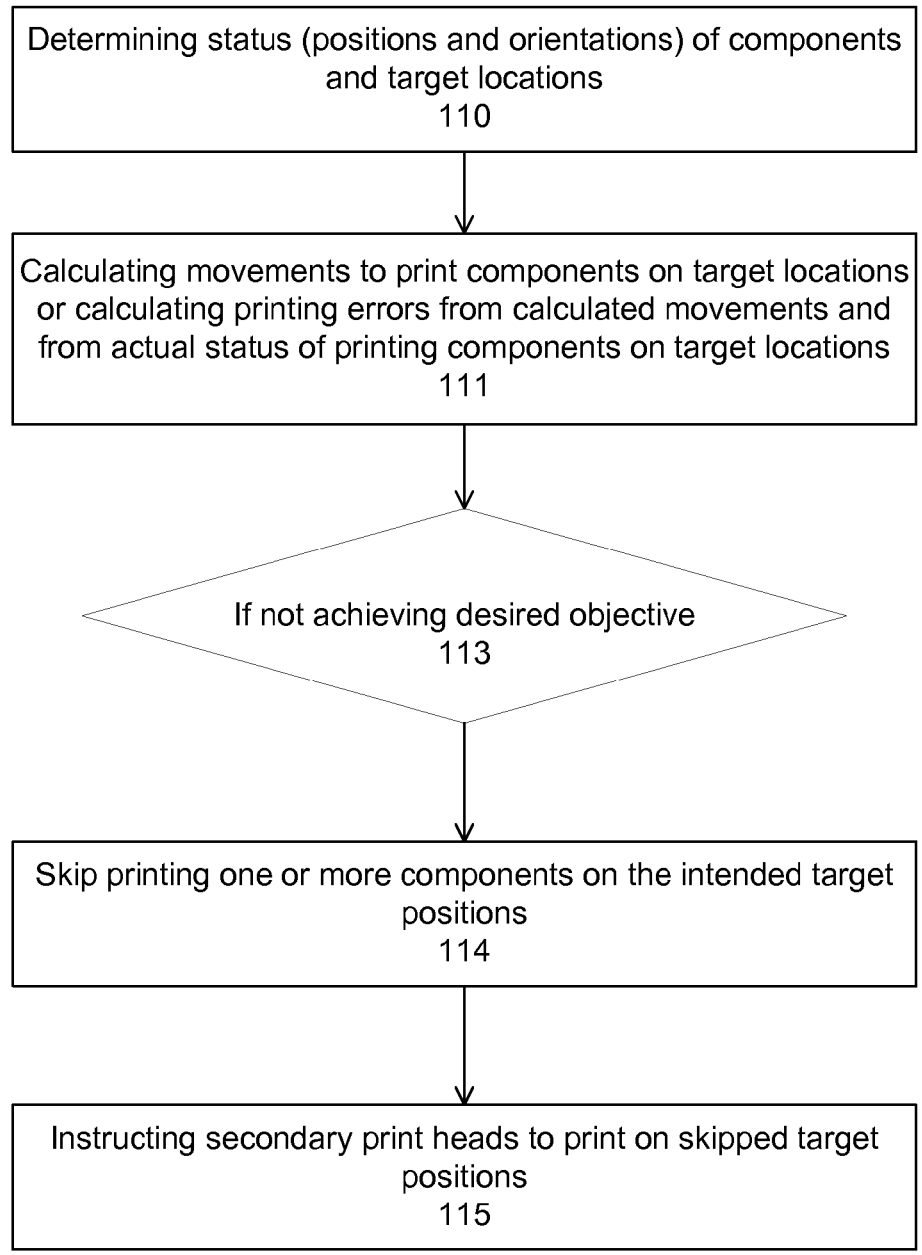
FIG. 6 illustrates another exemplary flowchart for the operation of the present invention.

FIG. 6 illustrates another exemplary flowchart for the operation of the present invention. In operation 110, a controller determines the status, such as the positions and orientations of the components and target locations. The status can be achieved by a machine vision system, or by a laser locator system. In operation 111, the controller calculates the movements of the main printheads to print the components on the corresponding target locations. Alternatively or additionally, the controller can calculate printing errors from the calculated movements and/or from the actual locations of the components and the target locations. In operation 113, a desired objective is determined from the calculated movements and/or from the calculated errors. If the objective is achievable, the printing process proceeds and continues. In operation 114, if the objective is not achievable, the controller can decide to skip printing one or more components on the intended target locations, until the objective is reached. For the missing target locations, the controller can instruct secondary printheads to print from the secondary printheads (operation 115)

Figure 7:
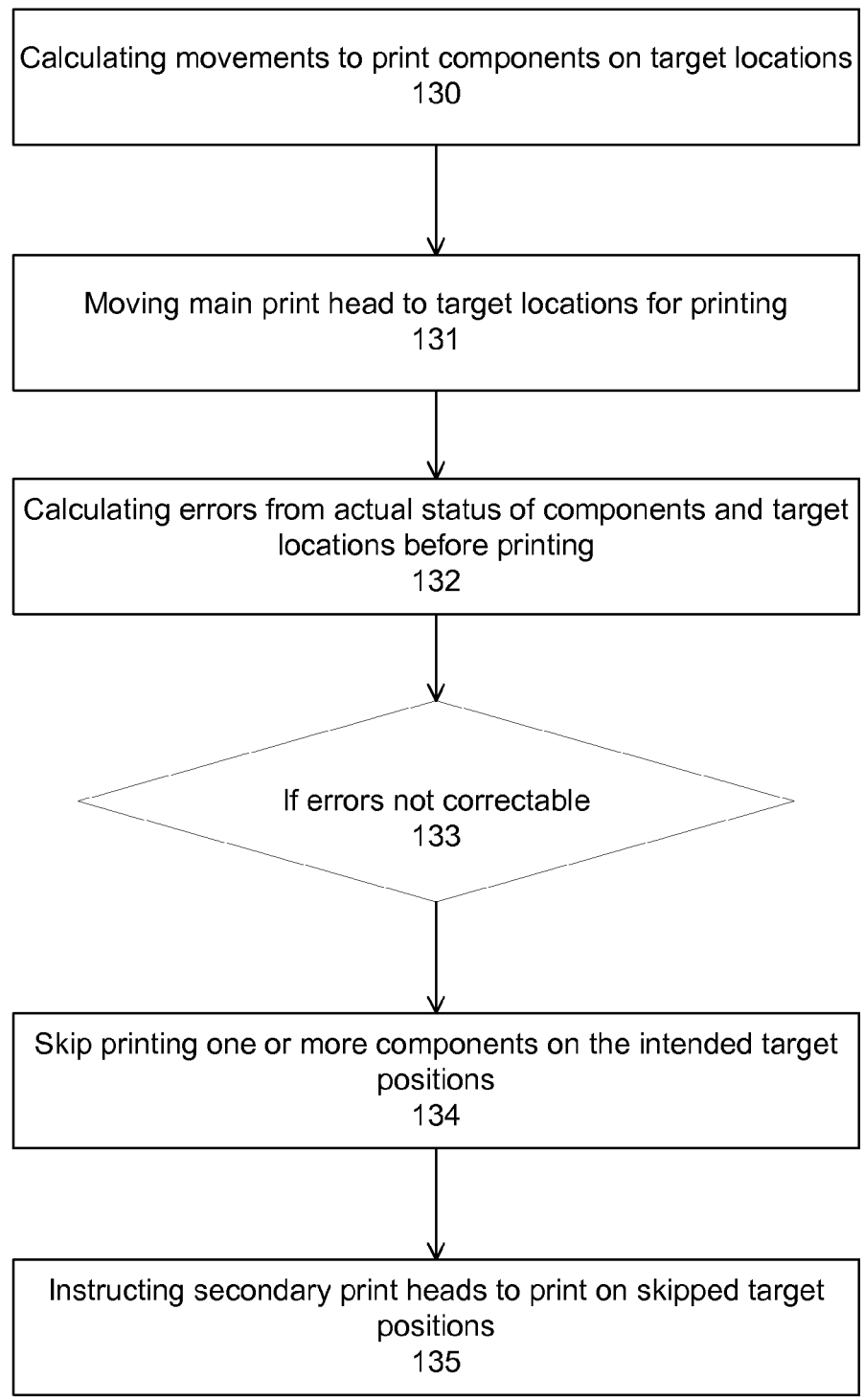
FIG. 7 illustrates an exemplary process flow to accommodate real time variations.

A further property of the DITAS is to accommodate distortions or abnormal motions which may occur in between the time when the initial target positional inputs are recorded and the time when printing occurs. FIG. 7 illustrates an exemplary process flow to accommodate real time variations. In operation 130, a DITAS controller calculates the movements to print the components on the intended target locations. In operation 131, the DITAS controller moves the main printheads to the individual target locations for printing. The controller can also cause the movement of the target substrate to advance. Before printing, the DITAS controller can determine the actual error of printing the component on the target location (operation 132). A component will be printed if it has been optically irradiated, since the heat input is relatively less precise in areal definition and is not generally used to select the components to be printed. In the case that the irradiation does not occur until at or immediately prior to the moment when the component arrives at the intended target location, it is possible to tell the system not to print a component there. In operation 133, the controller determines if the error is correctable. If the error is not correctable, for example, because the alignment is not within specification and it is not possible to meet the specification without causing some other position to be out of specification, the controller can instruct the main printheads to skip printing on the target locations (operation 134). This position can then be filled by the downstream (roving) printheads after the controller instructs the secondary printheads about the missing target locations. Operation 135 instructs secondary printheads to print on skipped target positions. In order to avoid excessive complexity and expense of the optical system and the data acquisition system, it is desirable to minimize the frequency of observation of the potentially numerous target positions as the web moves. Hence a predictive, self-adaptive algorithm may be implemented to predict most of the variable motion in between the original target sampling and the point at which the targets arrive at the printing position.

Since the printing process is expected to proceed continuously while a target web is unwound and rewound at the end, it may be necessary to refresh or refill the population of components on one or more printheads during a run. The printer is made with exchangeable printheads, so that an empty one is swapped, without stopping and preferably without slowing the operation, for a full one. Depending on the speed at which the web is normally running, it may not be possible to do this without causing some vacancies on the target. Downstream printheads, coupled with the DITAS, can ensure that all target positions receive a component. In some cases the web speed may have to be reduced, but not stopped.

Figure 8:
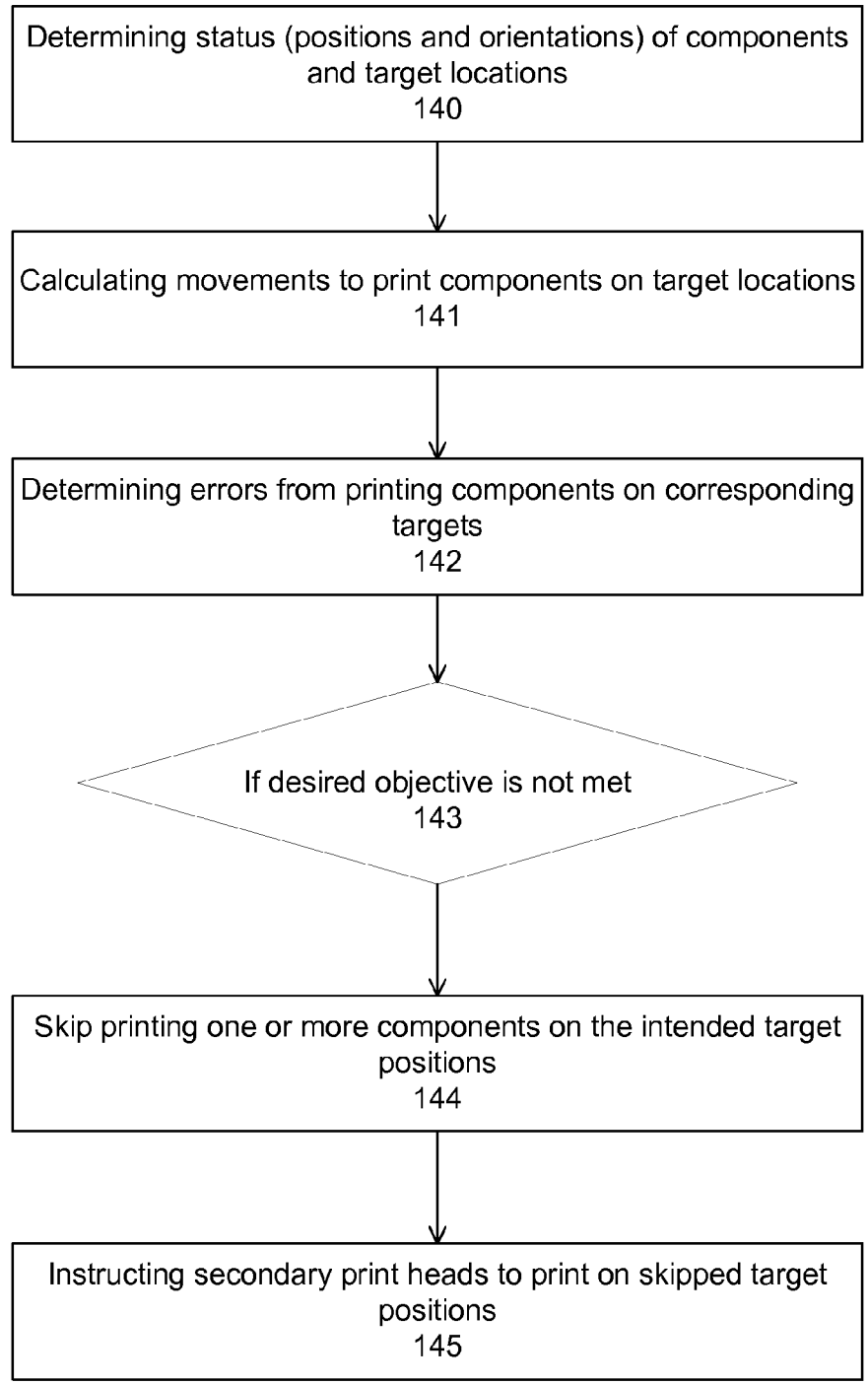
FIG. 8 illustrates another exemplary process flow for the operation of the present invention.

FIG. 8 illustrates another exemplary flowchart of an embodiment of the present invention. Operation 140 determines the status, for example, xy positions and rotation, of the functional blocks and the intended targets. The process can be performed by a locator subsystem, such as a vision assembly with camera view, or a laser beam locator. The process can be controlled by a controller, using appropriate software. Operation 141 calculates the movements of the main printheads to print the functional blocks on the targets. The substrate can also move, and thus the movements of the printheads are preferably relative to the substrate. The calculation can be one-to-one mapping, meaning individual functional blocks are mapped to next available target locations. For one track printing, one block is printed at a time. For multiple track printing, multiple blocks are printed at one time. The calculation can be designed to achieve the fastest printing speed, taken into account the locations of the functional blocks, the target locations, and the movements of the printheads and the substrate. Thus the printing might be out of order, some target locations might not get a block printed, or a block not released from the printheads. In an aspect, the calculation of the printheads movement is designed to achieve a desired throughput or a desired printing speed. In an aspect, the movements of the main printheads are designed to be running at a constant speed, to achieve a desired printing capability. In an aspect, the movements of the main printheads are designed to follow predetermined paths, with minimum deviations or with deviations less than a predetermined amount. The minimum deviations allow faster throughput, and higher reliability for the printheads. After calculating the movements of the printheads, deviations or errors in printing the functional blocks on the target locations are determined (operation 142). In an aspect, the printing process requires certain accuracy, for example, for accommodating subsequent process steps or for matching existing patterns on the substrate. Thus in certain cases, the main printheads need to deviate from normal printing process, such as additional movements from a predetermined path, to accommodate for the errors or deviations of the printing process. For example, the deviations can be calculated from estimated errors in printing such as the accumulated errors in the various movements of the printheads to print a component on the intended target. The estimated accumulated errors can include the errors in determining the locations of the functional blocks and the target, and the errors in movement accuracy in moving the printheads and the substrate. In an aspect, the deviations are determined after the printheads arrive at the intended targets, and the actual errors in printing can be measured.

If a desired objective is not met, or if the errors are not correctable without affecting the desired objective (operation 143), the main printheads skip printing the deviated components (operation 144), and secondary printheads are instructed to print on the skipping locations (operation 145). The commands and instructions can be generated by a controller or a software running on a computation system.

There are various reasons that a desired objective is not met, for example, due to the impossibility of the printing process or the correction process, such as a component might not be present to be printed at the intended location, or the main printheads are printing multiple simultaneous tracks, and correcting only one track is not possible without disturbing the other tracks. Other reasons include conflicting commands to the main printheads, for example the printheads need to move to correct one track and also need to remain undeviated to print another track. Another reason includes deviations or correction might slow down the speed of the main printheads, which affects the printing throughput of the printing system. Yet another reason includes deviations or correction might incur additional movements with high acceleration and/or deceleration of the main printheads, which affect the reliability of the printing system.

The foregoing discussion has been written with reference to a web. While the substrate is likely to be a web in the majority of practical applications where the product contains an RFID communication capability, the invention is also applicable to substrates which are rigid, for example PCBs moving on a conveyor belt.

The foregoing discussion has been written with reference to a single type of component. However, it is within the scope of the invention that many different types of components may be printed in a cluster, which are electrically interconnected subsequently and thereby form an integrated system. The various printheads which deliver the different components of such an integrated system may be located in any position, laterally or longitudinally, in the printer. Normally, each type of component would typically be printed by a set of printheads which are clustered together in a "station" along the web path. However, it may happen that one or more components could be most advantageously printed by one or more printheads which are located in a cluster in which the majority of printheads are delivering a different type of component. The DITAS allows the printer to determine the target locations which need the relevant component and to ensure that they are filled.

The present invention provides a computer-readable recording medium on which a program and data are recorded and which when executed by a data processing system causes the system to perform various methods of the present invention, such as when a plurality of user devices and servers are interconnected over a network. The present invention may also be embodied in a machine or computer readable format, e.g., an appropriately programmed computer, a software program written in any of a variety of programming languages. The software program would be written to carry out various functional operations of the present invention. Moreover, a machine or computer readable format of the present invention may be embodied or stored in a variety of program storage devices, such as a diskette, a hard disk, a CD, a DVD, a nonvolatile electronic memory, or the like. The software program may be run on a variety of devices, e.g. a processor.

Thus, a machine readable medium includes any mechanism that provides (i.e., stores and/or transmits) information in a form accessible by a machine (e.g., a computer, network device, personal digital assistant, manufacturing tool, any device with a set of one or more processors, etc.). For example, a machine readable medium includes recordable/non-recordable media (e.g., read only memory (ROM), random access memory (RAM), magnetic disk storage media, optical storage media, flash memory devices, etc.), as well as electrical, optical, acoustical or other forms of propagated signals (e.g., carrier waves, infrared signals, digital signals, etc.), etc.

Figure 9:
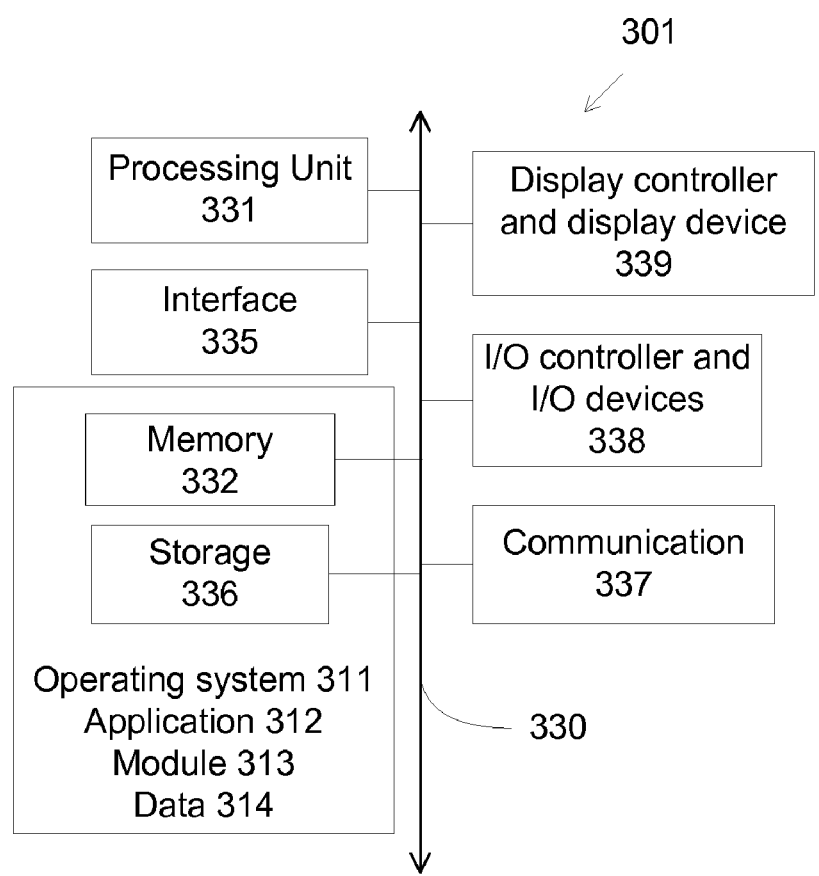
FIG. 9 illustrates an exemplary system, such as a computer or a mobile device system which may be used with the present invention.

FIG. 9 illustrates an exemplary system, such as a computer or a server system 301 which may be used with the present invention. Note that while FIG. 1 illustrates various components of a computer system, it is not intended to represent any particular architecture or manner of interconnecting the components as such details are not germane to the present invention. It will also be appreciated that network computers and other data processing systems which have fewer or more components may also be used with the present invention. The system 301 comprises a processing unit 331, a system memory 332, and a system bus 330. The processing unit 331 can be any of various available processors, such as single microprocessor, dual microprocessors or other multiprocessor architectures. The system bus 330 can be any type of bus structures or architectures. The system memory 332 can include volatile memory and nonvolatile memory. System 301 also includes storage media 336, such as removable/nonremovable, volatile/nonvolatile disk storage, such as magnetic disk drive, optical disk drive, or memory drive. A removable or non-removable interface 335 can be used to facilitate connection.

It will be apparent from this description that aspects of the present invention may be embodied, at least in part, in software. That is, the techniques may be carried out in a system or other data processing system in response to its processor, such as a microprocessor, executing sequences of instructions contained in a memory or a remote storage device. In various embodiments, hardwired circuitry may be used in combination with software instructions to implement the present invention. Thus, the techniques are not limited to any specific combination of hardware circuitry and software or to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor.

The system 301 further can include software to operate in a network environment, such as an operating system 311, system applications 312, program modules 313 and program data 314, which are stored either in system memory 332 or on disk storage 336. Various operating systems or combinations of operating systems can be used. I/O controller and I/O devices 338 can be used to enter commands or data, and can include a keyboard or a pointing device, preferably connected through I/O controller interface ports. Display devices and display controller 339 such as video or sound cards are provided to connect to some external output devices such as monitors, speakers, and printers.

System 301 can operate in a networked environment with other remote devices, which typically includes many or all of the elements described relative to device 301. Remote devices can be connected to device 301 through a communication 337.

What is claimed is:

1. A method for printing functional blocks on a target substrate, comprising:
   determining locations of the functional blocks and locations of corresponding targets, the functional blocks positioned on main printheads, and the targets located on the target substrate;
   calculating movements of the main printheads to position the functional blocks at the corresponding targets;
   determining deviations from printing the functional blocks on the corresponding targets;
   skipping printing from the main printheads based on the deviations; and
   instructing secondary printheads to print on the skipped target locations.

2. A method as in claim 1 wherein determining deviations comprises determining estimated errors in printing.

3. A method as in claim 1 wherein determining deviations comprises moving the main printheads to desired target locations and determining actual errors in printing.

4. A method as in claim 1 wherein skipping printing from the main printheads is based on a deviation that there are no functional blocks on the main printheads to print at corresponding target locations.

5. A method as in claim 1 wherein skipping printing from the main printheads is based on a deviation that there are conflicting movement commands of the main printheads at corresponding target locations.

6. A method as in claim 1 wherein skipping printing from the main printheads is based on a deviation that the main printheads movement deviations affects a printing throughput of the process of printing functional blocks on the target substrate.

7. A method as in claim 1 further comprising
   printing from the main printheads at constant printing speeds.

8. A method as in claim 1 further comprising
   moving the main printheads at a predetermined path with deviations less than a predetermined amount.

* * * * *